(12) United States Patent
Isom, III et al.

(10) Patent No.: US 6,813,748 B2
(45) Date of Patent: Nov. 2, 2004

(54) SYSTEM AND METHOD FOR ENABLING A VENDOR MODE ON AN INTEGRATED CIRCUIT

(75) Inventors: Melvin T. Isom, III, Durham, NC (US); Shailesh U. Hegde, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/254,467

(22) Filed: Sep. 24, 2002

(65) Prior Publication Data

US 2004/0060013 A1 Mar. 25, 2004

(51) Int. Cl.$^7$ .............................................. G06F 17/50
(52) U.S. Cl. ............................................... 716/1; 716/3
(58) Field of Search .............................. 716/1, 3–6, 17; 365/189, 200, 201, 226; 714/18–21, 28, 31, 724, 718

(56) References Cited

U.S. PATENT DOCUMENTS

| | | | | |
|---|---|---|---|---|
| 5,914,968 A | * | 6/1999 | Keeth | 714/721 |
| 5,936,974 A | * | 8/1999 | Roberts et al. | 714/718 |
| 6,240,535 B1 | * | 5/2001 | Farnworth et al. | 714/718 |
| 6,606,270 B2 | * | 8/2003 | Mullarkey | 365/189.01 |
| 2002/0186603 A1 | * | 12/2002 | Kyung | 365/201 |

* cited by examiner

*Primary Examiner*—Vuthe Siek
*Assistant Examiner*—Binh Tat
(74) *Attorney, Agent, or Firm*—Brinks Hofer Gilson & Lione

(57) ABSTRACT

A system and method for enabling a vendor mode on an integrated circuit. A method is disclosed for applying a potential to a no-connect pin, whose function is unknown to the customer, to prevent the accidental enabling of the vendor mode. Applying the potential to the no-connect pin while concurrently applying a distinct sequence of logic values to other pins signals the deliberate intention to activate the vendor mode.

10 Claims, 4 Drawing Sheets

SYSTEM AND METHOD FOR ENABLING A VENDOR MODE ON AN INTEGRATED CIRCUIT

FIELD OF THE INVENTION

This invention relates to integrated circuits. More particularly the invention relates to a system and method for enabling a vendor mode on an integrated circuit.

BACKGROUND

Many electronic devices and systems include integrated circuits for operating the devices and storing data during the operation of the devices. For example, electronic devices such as computers, printing devices, scanning devices, personal digital assistants, calculators, computer work stations, audio and/or video devices, communications devices such as cellular telephones, and routers for packet switched networks may include processors and memory in the form of integrated circuits. Advantages of using integrated circuits compared to other forms circuitry include space conservation and miniaturization, conserving limited battery resources, and cutting the costs of assembling the electronic devices.

Many integrated circuits include "vendor mode" circuitry that a vendor uses during the manufacturing of the integrated circuit, before the integrated circuit is sent out to a customer and incorporated into an electronic device, to test the internal operation of the integrated circuit. Vendor mode circuitry may include blocks of logic for testing whether selected features of the integrated circuit operate according to quality control specifications. Alternatively, the vendor mode circuitry may include redundant circuitry that substitutes for faulty sections of the integrated circuit in order to increase the production yield of the integrated circuits. Accessing the vendor mode circuitry may occur at a wafer level before the integrated circuit is packaged, or later at a packaged-chip level when the integrated circuit is in its final packaged form.

The vendor mode circuitry may be activated by a distinct sequence of logic values on selected pins of the integrated circuit package. Once in the vendor mode, the integrated circuit may disable the "user mode" or alternatively may operate in the vendor mode while the user mode is still active. The user mode corresponds to the command set and pin assignments available to the customer when the integrated circuit is incorporated into the electronic device and functioning. The vendor mode corresponds to another set of commands and a different assignment of pins that permit the vendor to select which test to perform on the integrated circuit, and to transfer test data between the vendor mode logic blocks and external testing equipment.

The vendor modes are intended to be available only to the vendor for testing, configuring, and/or modifying the integrated circuit internally before it is shipped to the customer. The customer is not allowed to access the vendor modes. Therefore the distinct sequence of logic values on selected pins of the integrated circuit package that activate the vendor mode are not disclosed to the customer.

During operation in the electronic device, however, the integrated circuit may accidentally receive the distinct sequence of logic values on the selected pins that cause the integrated circuit to exit the user mode and enter the vendor mode. Examples of circumstances that may give rise to the accidental generation of the vendor mode enabling logic values include noise on the selected pins, power surges, software errors that generate the distinct sequence, and user errors in providing data to the integrated circuit. When the integrated circuit accidentally enters the vendor mode, normal operation of the integrated circuit may be interrupted and the electronic device may cease to operate as intended.

In order to prevent the accidental entering into the vendor modes, the vendor may permanently disable the vendor mode circuitry before the integrated circuit is sent to the customer. For example, the vendor may blow a programmable fuse that disables the vendor mode circuitry and cannot be reset once it is blown. One example of a programmable fuse is a narrow polysilicon line on the integrated circuit that is blown by cutting with a precision laser. Another example of a programmable fuse is a narrow polysilicon line on the integrated circuit that is blown by passing a fusing current through the line.

But if an integrated circuit is returned from the customer because it is suspected of having failed in operation, the vendor may prefer to reactivate the vendor modes to test the integrated circuit and determine the cause of the failure, if any. The vendor may then determine whether the integrated circuit failed, the integrated circuit is operational and the fault lies in other components in the electronic device, or the customer accidentally enabled the vendor mode. Permanently disabled vendor mode circuitry, however, cannot be reactivated.

SUMMARY

A system and method are described below to address the need for a system and method of enabling a vendor mode on an integrated circuit that prevents accidental activation by a customer or by signals from the electronic device in which the integrated circuit is operating.

In accordance with one aspect of the invention, a system for enabling a vendor mode in an integrated circuit is provided that includes a coincidence circuit, a no-connect pin, and recognition circuitry. The coincidence circuit has a first input, a second input, and a first output. The first output activates vendor mode circuitry in response to a first signal on the first input and a concurrent second signal on the second input. The no-connect pin communicates with the first input. The recognition circuitry has a set of inputs and a second output. The second output is connected to the second input of the coincidence circuit and generates the second signal in response to a sequence of logic values on the set of inputs.

Another aspect is a method of enabling a vendor mode in an integrated circuit that includes (a) detecting a first potential at a no-connect pin, (b) detecting a sequence of logical values on a set of pins, and (c) activating vendor mode circuitry in response to whether (a) and (b) are concurrent.

Yet another aspect is a method of enabling a vendor mode in an integrated circuit, where the integrated circuit includes a no-connect pin and a set of pins for activating vendor mode circuitry in response to a sequence of logical values on the set of pins. The method includes applying a potential to the no-connect pin and concurrently applying the sequence of logical values to the set of pins.

A further aspect is a system for enabling a vendor mode in an integrated circuit that includes (a) means for detecting a first potential at a no-connect pin, having a first output, (b) means for detecting a sequence of logical values on a set of pins, having a second output, and (c) means for activating vendor mode circuitry, having a first input connected to the first output of (a), a second input connected to the second output of (b), and a third output. The third output activates the vendor mode circuitry in response to whether the first potential and the sequence of logical values are concurrent.

The foregoing and other features and advantages of preferred embodiments will be more readily apparent from the following detailed description, which proceeds with reference to the accompanying drawings.

DESCRIPTION OF THE PRESENTLY PREFERRED EMBODIMENTS

Figure 1:
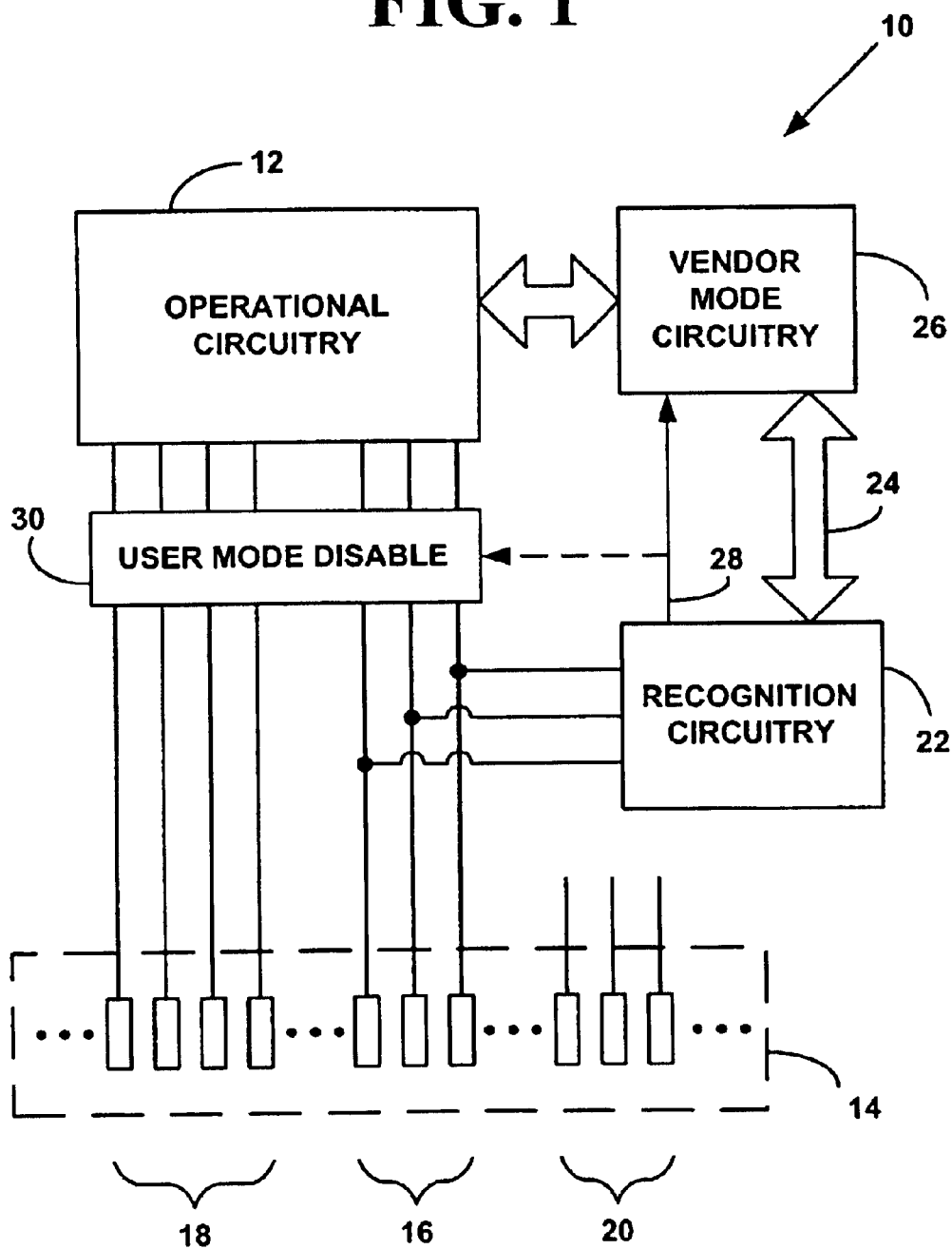
FIG. 1 is a block diagram illustrating a preferred configuration of an integrated circuit that includes vendor mode circuitry.

FIG. 1 is a block diagram illustrating a preferred configuration 10 of an integrated circuit that includes vendor mode circuitry 26. The operational circuitry 12 executes operations of the integrated circuit that are intended by the manufacturer to be available to the customer. The packaging 14 of the integrated circuit includes conducting pins 16, 18, 20. The pins 16, 18, 20 are typically metallic and are soldered to conducting paths on a circuit board of the electronic device. The conducting paths transfer electrical signals to and from other integrated circuits and components of the electronic device.

Other integrated circuits and programs running on the electronic device exchange data with the operational circuitry 12 through pins 16, 18 on the packaging 14 of the integrated circuit. A set of the pins 16 that connect to the operational circuitry 12 also connect to recognition circuitry 22. The packaging 14 of the integrated circuit also includes no-connect pins 20, which do not connect with circuitry on the integrated circuit. No-connect pins 20 are typically present on the packaging 14 because the packaging 14 conforms to an industry standard and the total number of pins 16, 18, 20 of this packaging 14 is also dictated by this standard. For example, memory devices such as Dynamic Random Access Memory ("DRAM") devices are typically encapsulated in a Thin Small Outline Package ("TSOP"), which may have between about 20 and 86 pins depending on the memory size of the DRAM.

Both the operational circuitry 12 and the recognition circuitry 22 may be fabricated on the same substrate using fabrication technology, such as Complementary Metal Oxide Semiconductor ("CMOS") technology, known to those of ordinary skill in the art. Alternatively, the operational circuitry 12 and the recognition circuitry 22 may be fabricated on separate substrates.

In the user mode, the operational circuitry 12 exchanges data with other integrated circuits and components through the pins 16, 18. The customer does not have access to vendor mode circuitry 26. The vendor, however, may access the vendor mode circuitry 26 by applying a sequence of logical values to the pins 16 that are connected to the inputs of the recognition circuitry 22. When the recognition circuitry 22 detects the sequence of logical values, it generates a "vendor mode enable" signal on an output 28 that activates the vendor mode circuitry 26. In a preferred embodiment, the signal on the output 20 also instructs a user mode disable circuit 30 to prevent communication between the operational circuitry 12 and the pins 16, 18. The user mode disable circuit 30 may be fabricated on the integrated circuit as multiple CMOS AND logic gates (not shown), one for each pin 16, 18, by methods familiar to those of ordinary skill in the art. In another preferred embodiment, the user mode disable circuitry 30 is not present on the integrated circuit and the vendor may access both the user mode and the vendor mode at the same time.

In a preferred embodiment, the integrated circuit is a DRAM integrated circuit and the recognition circuitry 22 is a Mode Register Set ("MRS") circuitry block on the DRAM integrated circuit. The MRS block receives input signals from the pins 16 that correspond in the user mode to operations on the array of memory cells. For example, the pins 16 may include those associated with Row Address Strobe ("RAS"), Column Address Strobe ("CAS"), Write Enable ("WE"), and Clock ("CLK") operations of the DRAM integrated circuit familiar to those of ordinary skill in the DRAM art. In another preferred embodiment, the recognition circuitry 22 may also receive input signals from pins 16 that are associated with addressing of the DRAM integrated circuit. For example, the MRS block may activate the vendor mode for the DRAM integrated circuit in response to a certain combination of signals on the RAS, CAS, and WE pins 16 in combination with an edge of the signal on the CLK pin. Alternatively, the MRS block may activate the vendor mode using the signals on the aforementioned pins 16 in combination with a designated subset of addresses on the addressing pins 16. It should be understood, however, that the invention is not limited to the DRAM integrated circuit and MRS block embodiment described above, and that the invention may be used in other integrated circuits, such as microprocessors or digital signal processors.

The vendor mode enable signal from the output 28 of the recognition circuitry 22 also activates the vendor mode circuitry 26. Other sequences of logic values on the set of pins 16 that are connected to the inputs to the recognition circuitry 22 may indicate to the vendor mode circuitry 26 which vendor mode is selected out of a set of possible vendor modes. In a preferred embodiment, when the vendor mode is enabled, the recognition circuitry 22 receives the other sequences of logic values from the set of pins 16 and generates a selection signal 24 to instruct the vendor mode circuitry 26 to activate a selected vendor mode. The vendor mode circuitry 26 performs the selected vendor mode operation on the operational circuitry 12 and returns result signals 24 to the recognition circuitry 22 for outputting on the set of pins 16.

The vendor mode circuitry 26 may include blocks of logic for testing whether selected features of the integrated circuit operate according to quality control specifications. For example, a DRAM integrated circuit may include blocks of logic for scanning the memory array and identifying faulty memory cells, rows, and/or columns. A DRAM integrated circuit may also include blocks of logic for testing whether address registers or read/write paths are operating according to design specifications. Also for example, a microprocessor integrated circuit may include blocks of logic for verifying correct operation of the arithmetic logic unit. Alternatively, the vendor mode circuitry 26 may include redundant circuitry that substitutes for faulty sections of the integrated circuit. For example, a DRAM integrated circuit may include redundant memory cells that substitute for failed memory cells within the memory array. In this vendor mode, the vendor mode circuitry 26 may blow programmable fuses that record the addresses of failed memory cells and transfer access for the addresses to designated redundant memory cells.

It should be understood, however, that the components shown in FIG. 1 are for illustrative purposes only and that the invention is not limited to the arrangement and components depicted in FIG. 1. For example, the recognition circuitry 22 and vendor mode circuitry 26 may be combined in a single circuit block in some embodiments, and in some embodiments the user mode disable circuit 30 is absent.

Coincidence Circuit

During operation in the electronic device, however, the integrated circuit may accidentally receive the sequence of logic values on the set of pins 16 that cause the integrated circuit to enter the vendor mode. For example, noise on the set of pins 16, power surges, or software errors may generate the sequence of logic values on the set of pins 16 that triggers the recognition circuitry 22 to generate the vendor mode enable signal. Accidentally activating the vendor mode when the integrated circuit is in operation in the electronic device may severely impede the operation of the electronic device and result in wrongly diagnosing that the integrated circuit has failed.

Figure 2:
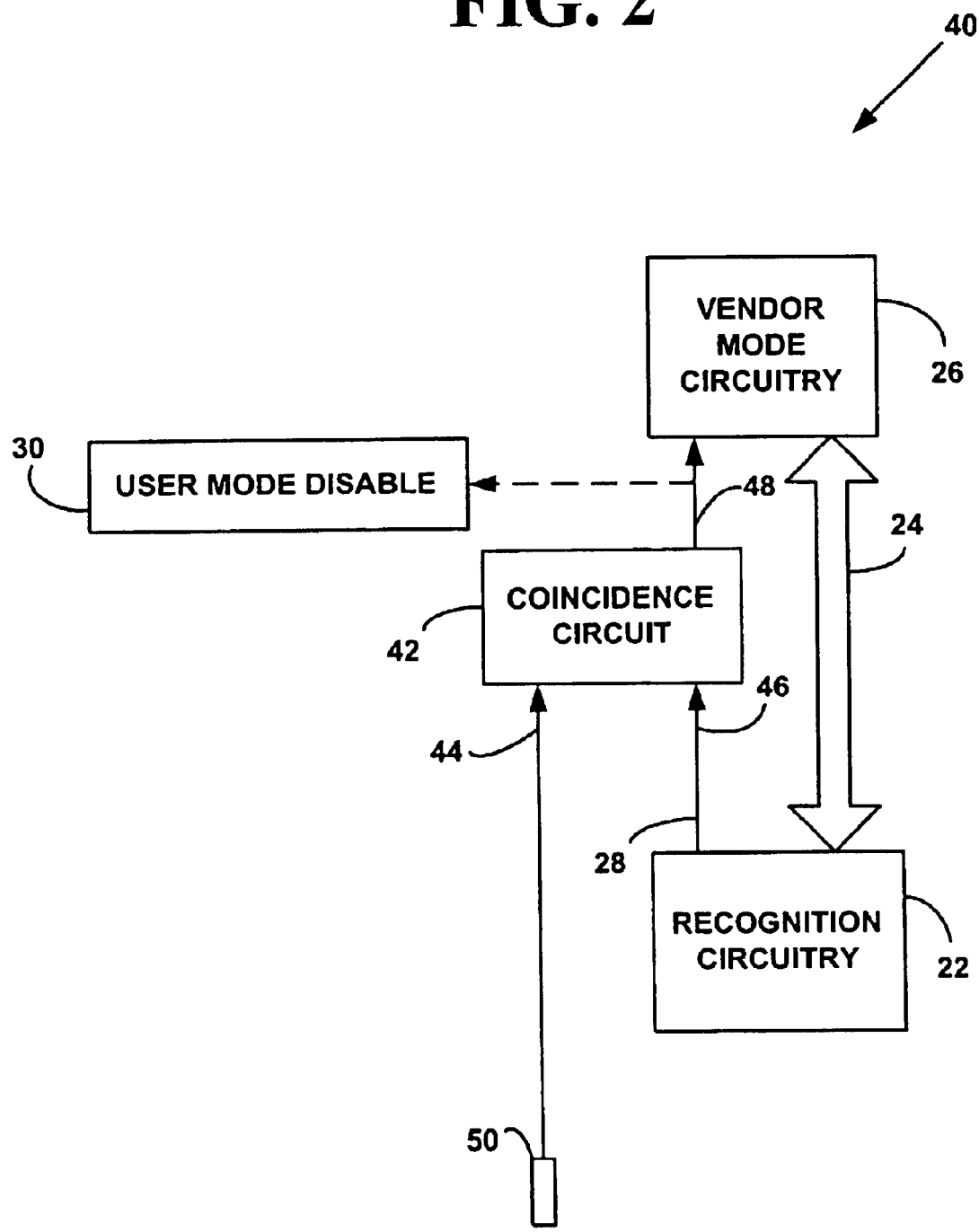
FIG. 2 is a block diagram illustrating a preferred system for enabling a vendor mode on an integrated circuit.

FIG. 2 is a block diagram illustrating a preferred system 40 for enabling a vendor mode on an integrated circuit. The system 40 includes a coincidence circuit 42, a no-connect pin 50, and the recognition circuitry 22. The coincidence circuit 42 has a first input 44, a second input 46, and a first output 48. The first output 48 activates vendor mode circuitry 26 in response to a first signal on the first input 44 and a concurrent second signal on the second input 46. The no-connect pin 50 is one of the no-connect pins 20 shown in FIG. 1, and is in communication with the first input 44 of the coincidence circuit 42. The recognition circuitry 22 has a set of inputs (not shown in FIG. 2) and a second output 28. The second output 28 is connected to the second input 46 of the coincidence circuit 42. The second output 28 of the recognition circuit 22 generates the second signal in response to a sequence of logic values on the set of inputs to the recognition circuit 22. The coincidence circuit 42 may be fabricated on the same substrate as the vendor mode circuitry 26 or recognition circuitry 22 using fabrication technology, such as CMOS technology, known to those of ordinary skill in the art.

Figure 3:
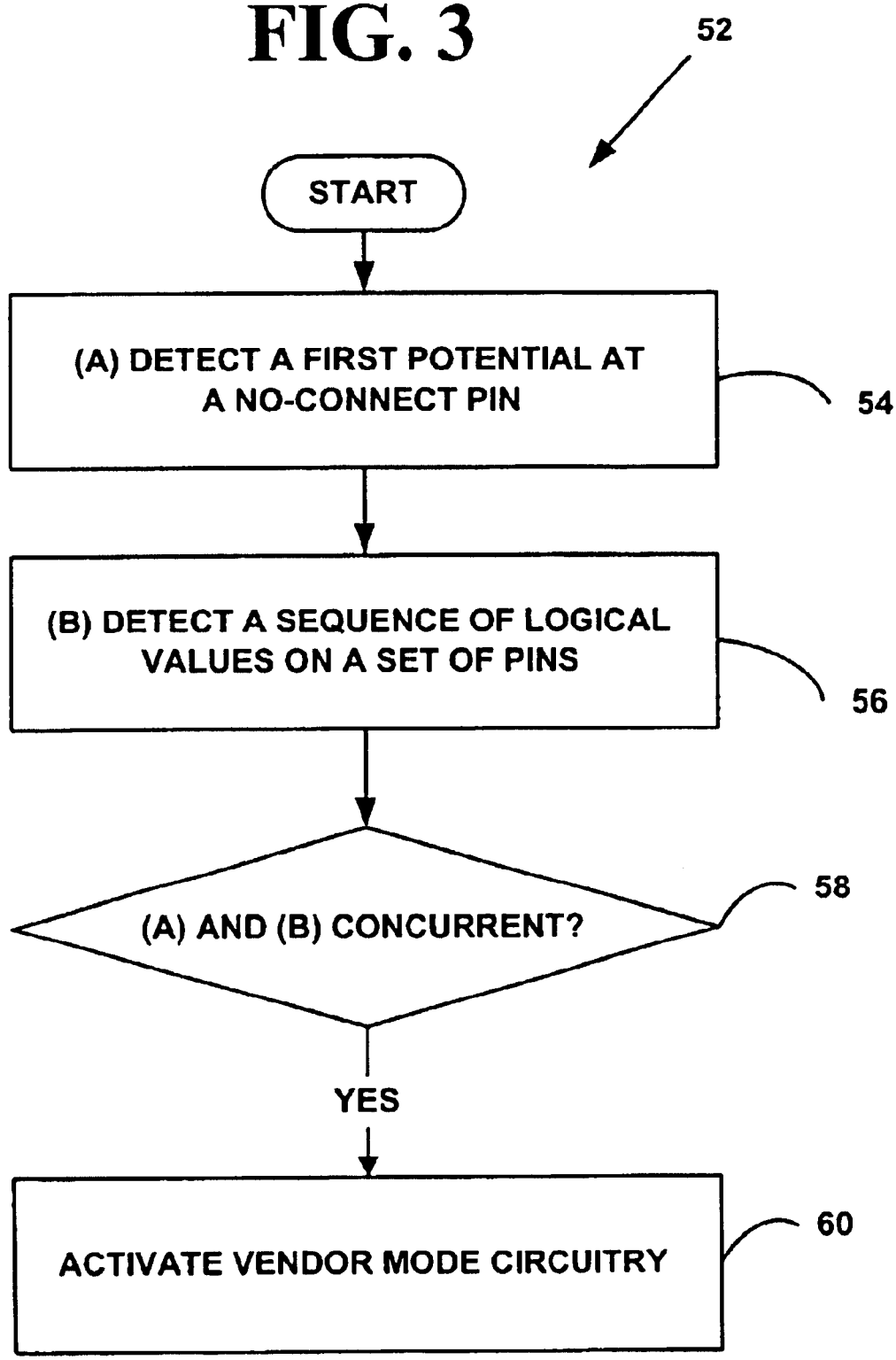
FIG. 3 is a flow diagram illustrating a preferred method for enabling a vendor mode in an integrated circuit.

FIG. 3 is a flow diagram illustrating a preferred method 52 for enabling a vendor mode in an integrated circuit. The method 52 includes (a) detecting a first potential at a no-connect pin 50 at step 54. At step 56, the method 52 (b) detects a sequence of logical values on a set of pins 16. In response to whether (a) and (b) are concurrent at step 58, the method 52 (c) activates vendor mode circuitry 26 at step 58.

With reference to FIG. 2, the vendor mode circuitry 26 is activated when the no-connect pin 50 is driven to a first potential and concurrently the recognition circuitry 22 receives the sequence of logical values. It should be understood that concurrently applying the first potential to the no-connect pin 50 and applying the sequence of logical values means that both applications overlap in time and do not necessarily occur simultaneously. In this manner, accidental activation of the vendor mode may be avoided because activation requires a concurrent potential on the no-connect pin 50. Because the customer is unaware of the function of the no-connect pin 50, it is unlikely that the customer would apply the potential to the no-connect pin 50. Moreover, a data sheet for the integrated circuit may indicate to the customer that unused pins 20, such as the no-connect pin 50, should be maintained at another potential, such as ground, which does not provide the first signal to operate the coincidence circuit 42. The vendor mode remains disabled unless the no-connect pin 50 is driven to the first potential. The customer is unaware that the no-connect pin 50 may have a function and accidentally activate the vendor mode.

In response to detecting the first potential on the no-connect pin 50 and the sequence of logic values concurrently on the set of pins 16, the first output 48 of the coincidence circuit 42 generates the vendor mode enable signal that activates the vendor mode circuitry 26. The vendor mode enable signal may also instruct the user mode disable circuit 30 to prevent communication between the operational circuitry 12 and the pins 16, 18 if the user mode disable circuit 30 is present in the embodiment. In the vendor mode, another sequence of logic values on the set of pins 16 selects the particular vendor mode to be run by the vendor mode circuitry 26. The vendor mode circuitry 26 performs the selected vendor mode operation on the operational circuitry 12 and returns result signals 24 to the recognition circuitry 22 for outputting on the set of pins 16.

Figure 4:
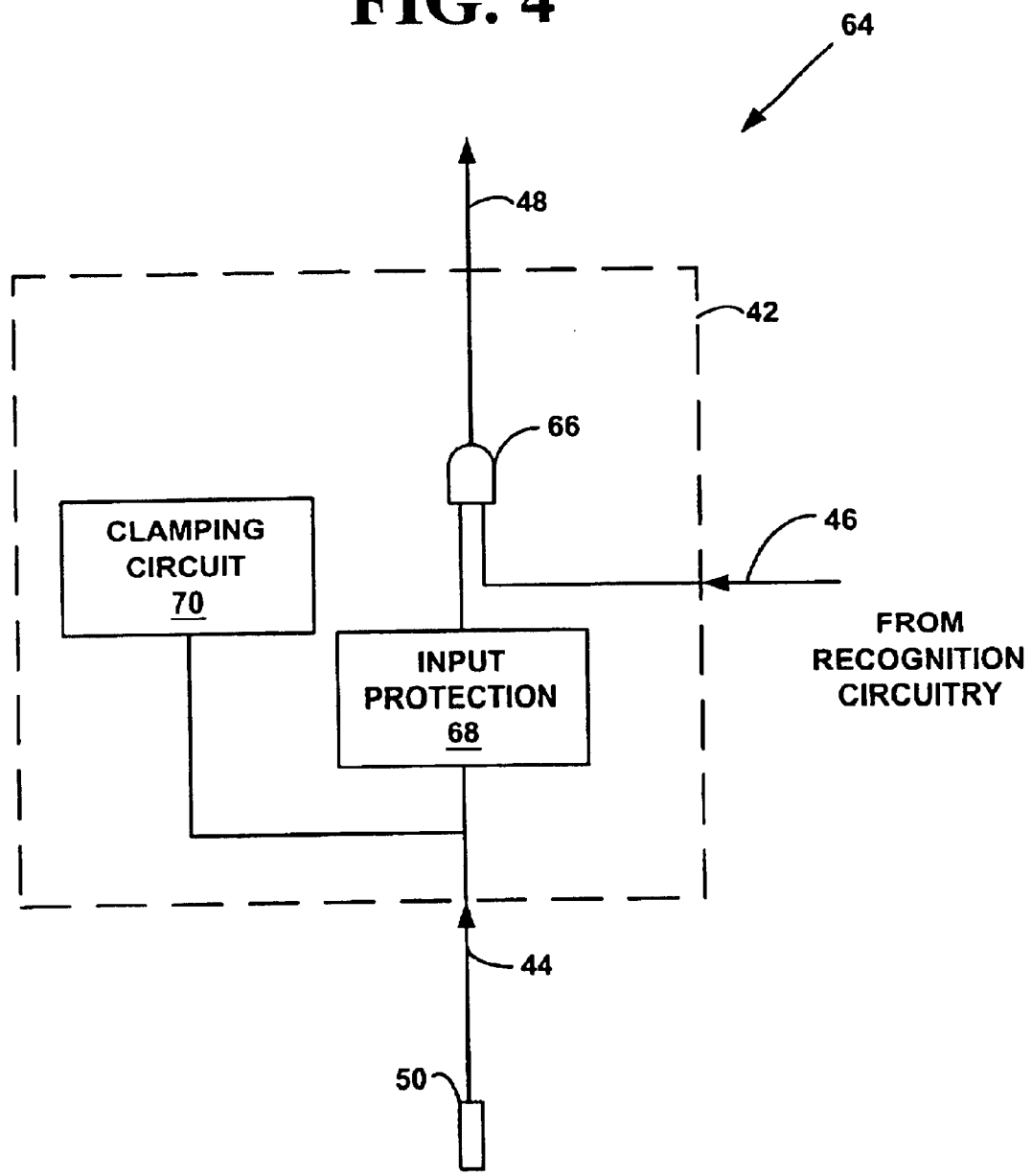
FIG. 4 is a block diagram illustrating a preferred configuration of the coincidence circuit of FIG. 2.

FIG. 4 is a block diagram illustrating a preferred configuration 64 of the coincidence circuit 42 of FIG. 2. The coincidence circuit 42 includes an AND logic gate 66, an input protection circuit 68, and a clamping circuit 70. The AND logic gate 66 may be constructed on the integrated circuit using CMOS techniques familiar to those of ordinary skill in the art. The input protection circuit 68 may include a high input impedance amplifying device, such as a MOSFET transistor, that operates over a wide range of input potentials to protect the AND logic gate 66 from excessive potentials on the no-connect pin 50, such as power supply spikes or electrostatic discharge.

The clamping circuit 70 maintains the no-connect pin 50 at a clamping potential, such as the ground potential, when there is no external potential applied to the no-connect pin 50. Maintaining the no-connect pin 50 at the clamping potential results in a logical FALSE signal at the input to the AND logic gate 66 connected to the input protection circuit 68. The AND logic gate 66 provides a logical FALSE signal at the output 48 of the coincidence circuit 42 and does not activate the vendor mode circuitry 26.

The clamping circuit 70 may include a resistor between the input 44 of the coincidence circuit 42 and ground potential. In this manner, the input 44 of the coincidence circuit 42 and the no-connect pin 50 is drawn to ground potential in the absence of an external potential on the no-connect pin 50, resulting in a logical FALSE signal at the output 48 of the coincidence circuit 42. When an external potential is applied to the no-connect pin 50 by a potential source that has lower impedance than the resistor, the potential at the input 44 to the coincidence circuit 42 does not remain at ground potential, but varies to match the potential of the potential source. Applying the potential that activates the vendor mode to the no-connect pin 50 results in a logical TRUE signal at the input to the AND logic gate 66 connected to the input protection circuit 68. If the other input 46 to the coincidence circuit 42 also receives a logical TRUE signal, the output 48 of the logic AND gate 66 provides a logical TRUE signal at the output 48 of the coincidence circuit 42 and activates the vendor mode circuitry 26.

The foregoing detailed description is merely illustrative of several physical embodiments of the invention. Physical variations of the invention, not fully described in the specification, may be encompassed within the purview of the claims. In addition, the steps of the flow diagrams may be taken in sequences other than those described, and more or fewer elements or components may be used in the block diagrams. Accordingly, any narrower description of the elements in the specification should be used for general guidance, rather than to unduly restrict any broader descriptions of the elements in the following claims.

We claim:

1. A system for enabling a vendor mode in an integrated circuit comprising:
    a coincidence circuit having a first input, a second input, and a first output, wherein the first output activates the vendor mode by a vendor mode circuitry in response to a first signal on the first input and a concurrent second signal on the second input;
    a no-connect pin in communication with the first input of the coincidence circuit; and
    recognition circuitry having a set of inputs and a second output, wherein the second output is connected to the second input of the coincidence circuit and generates the second signal in response to a sequence of predetermined logic values applied to the set of inputs of said recognition circuitry.

2. The system of claim 1 wherein the coincidence circuit comprises a logic AND gate.

3. The system of claim 2 wherein coincidence circuit comprises an input protection circuit connected between the first input and the no-connect pin, and wherein the input protection circuit generates the first signal in response to a first potential at the no-connect pin.

4. The system of claim 2 wherein the coincidence circuit comprises a clamping circuit connected to the no-connect pin.

5. The system of claim 1 wherein the integrated circuit comprises a DRAM integrated circuit and the recognition circuitry comprises DRAM Mode Register Set circuitry.

6. Thy system of claim 1 further comprising:
    a user mode disable circuit in communication with the coincidence circuit.

7. A system for enabling a vendor mode in an integrated circuit, comprising;

(a) means for detecting a first potential at a no-connect pin of a coincidence circuit, wherein said mean detecting the first potential generates a first output signal
    (b) means for detecting of a predetermined sequence of logical values on a set of pins a recognition circuit, wherein said means detecting a predetermined sequence of logical values generate a second output signal and
    (c) means for activating vendor mode circuitry, wherein said vendor mode circuitry comprising a first input connected to the first output of (a), a second input connected to the second output of (b), and a third output, wherein the third output activates the vendor mode by the vendor mode circuitry only if the first potential and predetermined sequence of logical values are detected concurrently.

8. The system of claim 7 further comprising:
    (d) means for disabling a user mode of operation for its integrated circuit.

9. A. system for enabling a vendor mode in a DRAM integrated circuit comprising:
    a logic AND gate having a first input, a second input, and a first output, wherein the first output activates the vendor mode by the vendor mode circuitry in response to a first signal on the first input and a concurrent second signal on the second input;
    a no-connect pin coupled to said first input;
    an input protection circuit connected between the first input and the no-connect pin and that generates the first signal in response to a first potential on the no-connect pin; and
    Mode Register Set circuitry for the DRAM integrated circuit having a set of inputs and a second output, wherein the second output is connected to the second input of the logic AND gate and generates the second signal in response to a predetermined sequence of logic values on the set of inputs.

10. The system of claim 9 further comprising a clamping circuit connected to the no-connect pin.

* * * * *